(12) United States Patent
Caraccio et al.

(10) Patent No.: US 12,148,498 B2
(45) Date of Patent: Nov. 19, 2024

(54) POST PACKAGE REPAIR MANAGEMENT

(71) Applicant: Micron Technology, Inc., Boise, ID (US)

(72) Inventors: Danilo Caraccio, Milan (IT); Antonino Capri, Bergamo (BG); Daniele Balluchi, Cernusco Sul Naviglio (IT); Massimiliano Patriarca, Milan (IT)

(73) Assignee: Micron Technology, Inc., Boise, ID (US)

( * ) Notice: Subject to any disclaimer, the term of this patent is extended or adjusted under 35 U.S.C. 154(b) by 158 days.

(21) Appl. No.: 17/959,191

(22) Filed: Oct. 3, 2022

(65) Prior Publication Data

US 2023/0395184 A1 Dec. 7, 2023

Related U.S. Application Data

(60) Provisional application No. 63/348,424, filed on Jun. 2, 2022.

(51) Int. Cl.
| | | |
|---|---|---|
| *G11C 11/406* | (2006.01) | |
| *G11C 11/4093* | (2006.01) | |
| *G11C 29/52* | (2006.01) | |

(52) U.S. Cl.
CPC ........ *G11C 29/52* (2013.01); *G11C 11/40615* (2013.01); *G11C 11/4093* (2013.01)

(58) Field of Classification Search
CPC .............. G11C 29/52; G11C 11/40615; G11C 11/4093; G11C 2029/0411; G11C 29/76; G11C 29/4401

USPC ............................................. 365/185.09, 201
See application file for complete search history.

(56) References Cited

U.S. PATENT DOCUMENTS

| | | | |
|---|---|---|---|
| 9,030,899 B2 | 5/2015 | Lee | |
| 9,202,595 B2 | 12/2015 | Wilson et al. | |
| 9,418,762 B1* | 8/2016 | You ....................... | G11C 29/787 |
| 9,767,922 B2 | 9/2017 | Lee et al. | |
| 9,922,729 B2 | 3/2018 | Wilson et al. | |
| 10,403,390 B1* | 9/2019 | Wilson ................... | G11C 17/16 |
| 10,770,164 B1* | 9/2020 | Baughen ................ | G11C 29/38 |
| 2014/0351673 A1* | 11/2014 | Ware ..................... | G11C 29/808 |
| | | | 714/764 |
| 2016/0300627 A1* | 10/2016 | You ........................ | G11C 29/76 |
| 2020/0058365 A1* | 2/2020 | Kim ........................ | G11C 29/70 |
| 2020/0151070 A1* | 5/2020 | Lee .......................... | G06F 12/10 |
| 2020/0327951 A1* | 10/2020 | Jung ....................... | G11C 17/18 |
| 2020/0388311 A1* | 12/2020 | Lee ........................... | G11C 7/24 |
| 2021/0200625 A1* | 7/2021 | Park ...................... | G06F 11/0751 |
| 2021/0263646 A1* | 8/2021 | Chin ...................... | G06F 11/073 |
| 2021/0311638 A1* | 10/2021 | Smith ..................... | G11C 29/12 |
| 2022/0027229 A1* | 1/2022 | Chao ..................... | G06F 11/073 |

(Continued)

*Primary Examiner* — Michael T Tran
(74) *Attorney, Agent, or Firm* — Brooks, Cameron & Huebsch, PLLC

(57) ABSTRACT

A soft post package repair (sPPR) request is detected. Data stored in a target row of a memory array associated with the sPPR request is written to a buffer. Execution of non-maintenance requests on the target row is suspended. Responsive to suspension of execution of non-maintenance requests on the target row, the sPPR request is executed on the target row. Subsequent to completion of the sPPR request, execution of non-maintenance requests on the target row is resumed and the data stored in the buffer is written to the repaired target row.

20 Claims, 5 Drawing Sheets

(56) References Cited

U.S. PATENT DOCUMENTS

2022/0197739 A1\* 6/2022 Ryu ...................... G06F 11/106
2022/0328125 A1\* 10/2022 Wilson ................. G11C 29/025

\* cited by examiner

POST PACKAGE REPAIR MANAGEMENT

PRIORITY INFORMATION

This application claims the benefit of U.S. Provisional Application Ser. No. 63/348,424 filed on Jun. 2, 2022, the contents of which are incorporated herein by reference.

TECHNICAL FIELD

The present disclosure relates generally to semiconductor memory and methods, and more particularly, to apparatuses, systems, and methods of post package repair (PPR) management.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, ferroelectric random access memory (FeRAM), and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system. A controller may be used to manage the transfer of data, commands, and/or instructions between the host and the memory devices.

DETAILED DESCRIPTION

Figure 1:
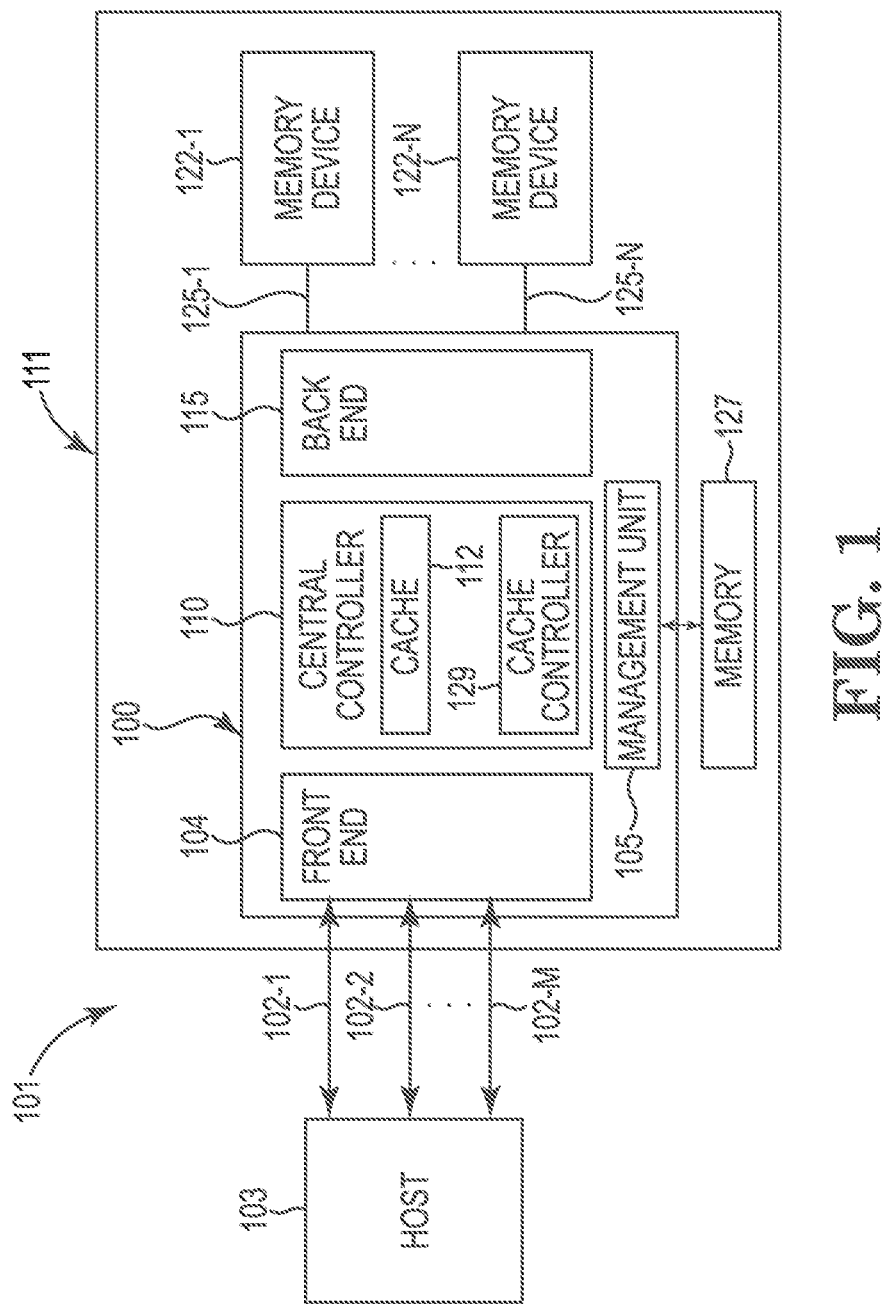
FIG. 1 illustrates a functional block diagram in the form of a computing system including post package repair (PPR) management in accordance with a number of embodiments of the present disclosure.

Systems, apparatuses, and methods related to post package repair (PPR) management are described. To address transient and non-transient memory failures, memory devices can include a PPR capability. For instance, a controller of a memory device can detect permanent and/or transient errors based on error correction codes (ECC). PPR enables a controller to remap a faulty row of a memory device to another row of the memory device. PPR can be performed as soft PPR (sPPR) and/or hard PPR (hPPR), for example.

hPPR can include permanently remapping accesses from a faulty row to another row. sPPR can include temporarily remapping accesses from a faulty row to another row. Although a remapping of a row as part of a sPPR can survive a "warm" reset, depending on implementation, it may not survive a power cycle. A remapping of a row as part of a hPPR, on the other hand, can survive any kind of reset including a power cycle because of non-volatile programming performed as part of hPPR.

A memory device can notify a host of a need for maintenance to be performed. For example, a Compute Express Link (CXL) memory device can notify a host via CXL events reporting. Although some embodiments described herein include a CXL memory device, embodiments of the present disclosure are not so limited.

CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as I/O protocol, memory protocol (e.g., initially allowing a host to share memory with an accelerator), and coherency interface. Aspects of the present disclosure provides a unified interface to manage maintenance commands, particularly PPR requests. For example, a mailbox command can be added to a command set of a CXL memory device to initiate performance of a maintenance operation such as PPR.

As used herein, the singular forms "a," "an," and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." As used herein, "coupled to" or "coupled with" generally refers to a connection between components, which can be an indirect communicative connection or direct communicative connection (e.g., without intervening components), whether wired or wireless, including connections such as electrical, optical, magnetic, and the like. The terms "data" and "data values" are used interchangeably herein and can have the same meaning, as appropriate to the context.

The figures herein follow a numbering convention in which the first digit or digits correspond to the drawing figure number and the remaining digits identify an element or component in the drawing. Similar elements or components between different figures may be identified by the use of similar digits. For example, element 122 can represent element 22 in FIG. 1, and a similar element can be labeled

Figure 2:
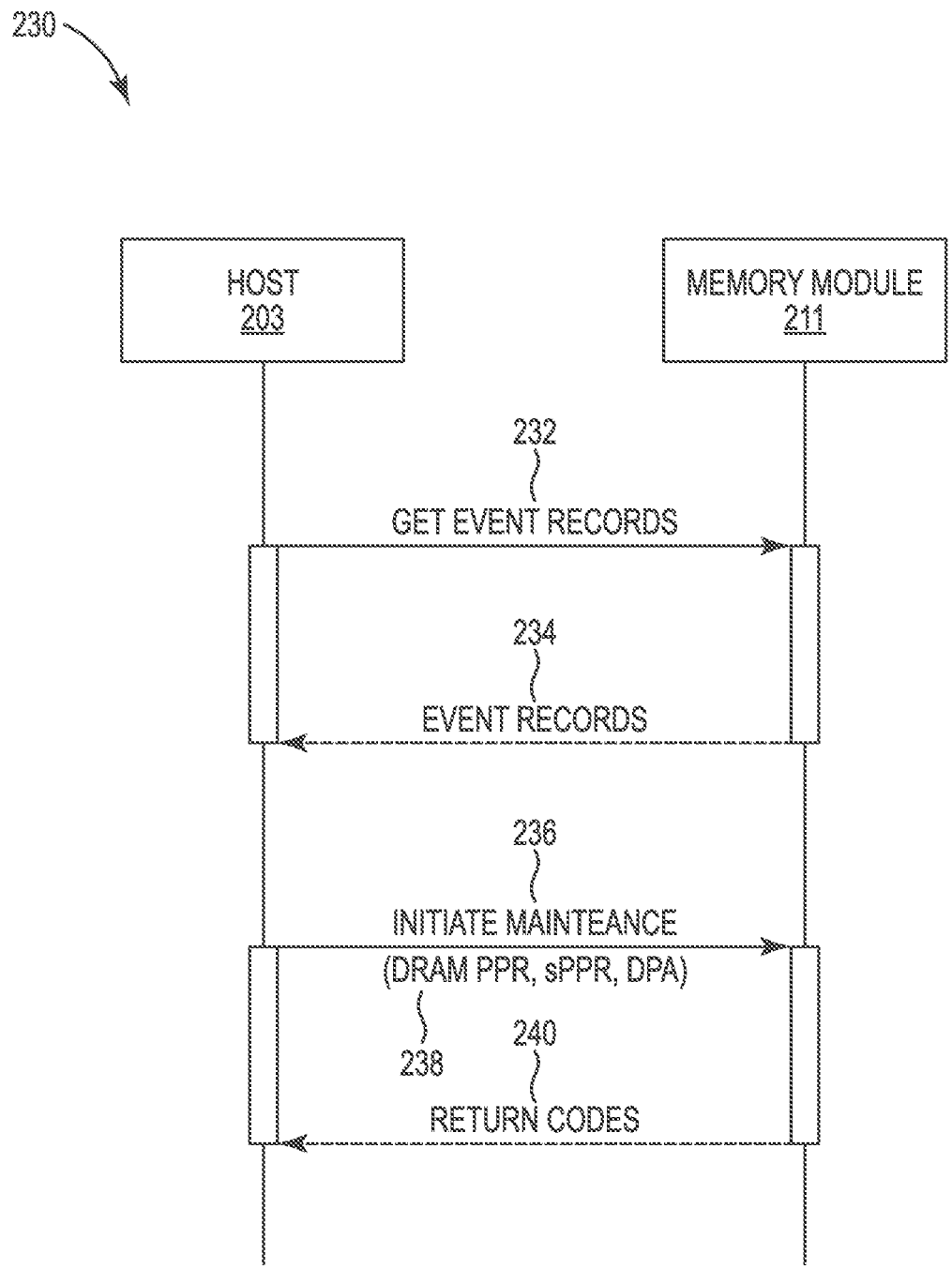
FIG. 2 is a diagram representative of PPR management in accordance with a number of embodiments of the present disclosure.

222 in FIG. 2. Analogous elements within a figure may be referenced with a hyphen and extra numeral or letter. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 illustrates a functional block diagram in the form of a computing system 101 including PPR management in accordance with a number of embodiments of the present disclosure. The computing system 101 includes a memory module 111. The memory module 11 can include a memory controller 100 and one or more memories and/or memory devices coupled thereto.

The memory controller 100 can include a front end portion 104, a central controller portion 110, and a back end portion 115. The computing system 101 can further include a host 103, memory devices 122-1, . . . , 122-N (collectively referred to as memory devices 122), and a memory 127. The memory 127 can be a flash memory accessible via a serial peripheral interface (SPI). The memory 127 can include other circuitry, firmware, software, or the like, whether alone or in combination. In some embodiments, non-volatile memory can be used to store persistent code images, data, configuration parameters, and/or logs.

The front end portion 104 includes an interface to couple the memory controller 100 to the host 103 through input/output (I/O) lanes 102-1, 102-2, . . . , 102-M (collectively referred to as I/O lanes 102). The front end portion includes interface management circuitry to manage the I/O lanes 102. The front end portion can include any quantity of the I/O lanes 102 (e.g., eight, sixteen I/O lanes 102). In some embodiments, the I/O lanes 102 can be configured as a single port. In some embodiments, the interface between the memory controller 100 and the host 103 can be a PCIe physical and electrical interface operated according to a CXL protocol. In some embodiments, the computing system 101 can be a CXL compliant memory system (e.g., the memory system can include a PCIe/CXL interface).

The central controller portion 110 includes a cache memory 112 (alternatively referred to as a cache). However, embodiments of the present disclosure are not limited to the central controller portion 110 including a cache memory. For example, a cache memory may not needed if a buffer (e.g., a dedicated buffer) is allocated for temporarily storing the data of the row being repaired.

In some embodiments, in response to receiving a read request for data stored in the cache memory 112, the data can be provided to the host 103 as requested without further accessing the memory device 122. In some embodiments, in response to receiving a write request, data can be stored in the cache memory 112 prior to writing the data to the memory device 122.

In some embodiments, the central controller portion 110 can receive a PPR request from the memory device 122 and, in response to the PPR request, perform PPR on a row of the memory device 122 associated with the PPR request. In some embodiments, the central controller portion 110, can autonomously analyze row reliability of the memory device 122 and perform PPR on a row of the memory device 122 based on that analysis. In some embodiments, the central controller portion 110 can receive a PPR request from the host 103 and, in response to the PPR request, perform PPR on a row of the memory device 122 associated with the PPR request. Whether the central controller portion 110 performs PPR in response to a PPR request or autonomously can be based on depending on an internal policy of the central controller portion 110.

Non-limiting examples of memory operations include a memory operation to read data from the cache memory 112 and/or a memory device 122 and an operation to write data to the cache memory 112 and/or a memory device 122. In some embodiments, the central controller portion 110 can control writing of multiple pages of data substantially simultaneously.

As used herein, the term "substantially" intends that the characteristic may not be absolute, but is close enough so as to achieve the advantages of the characteristic. For example, "substantially simultaneously" is not limited to operations that are performed absolutely simultaneously and can include timings that are intended to be simultaneous but due to manufacturing limitations may not be precisely simultaneously. For example, due to read/write delays that may be exhibited by various interfaces, media controllers that are utilized "substantially simultaneously" may not start or finish at exactly the same time. For example, the multiple memory controllers can be utilized such that they are writing data to the memory devices at the same time regardless if one of the media controllers commences or terminates prior to the other.

The back end portion 115 can include media control circuitry and a physical (PHY) layer that couples the memory controller 100 to the memory devices 122. As used herein, the term "PHY layer" generally refers to the physical layer in the Open Systems Interconnection (OSI) model of a computing system. The PHY layer can be the first (e.g., lowest) layer of the OSI model and used to transfer data over a physical data transmission medium. In some embodiments, the physical data transmission medium can include channels 125-1, . . . , 125-N (collectively referred to as the channels 125). The channels 125 can include a sixteen-pin data bus and a two pin data mask inversion (DMI) bus, for example, among other possible buses. In some embodiments, the back end portion 115 can communicate (e.g., transmit and/or receive) data to and/or from the memory devices 122 via the data bus. In some embodiments, error detection information and/or error correction information can be communicated to and/or from the memory devices 122 via the DMI bus. However, embodiments of the present disclosure are not so limited. For example, the back end portion 115 can communicate data, and/or error detection information and/or error correction information, to and/or from the memory devices 122 via the DMI bus. Error detection information and/or error correction information can be communicated contemporaneously with the exchange of data. In some embodiments, data and ECC information can be mapped respectively in different ways across the data and DMI buses to improve, possibly maximize, performance of the computing system 101.

An example of the memory devices 122 is dynamic random access memory (DRAM). DRAM can be operated according to a protocol, such as low-power double data rate (LPDDRx), (e.g., LPDDRx DRAM devices, LPDDRx memory, etc.). The "x" in LPDDRx refers to any of a number of generations of the protocol (e.g., LPDDR5). In some embodiments, at least one of the memory devices 122 is operated as an LPDDRx DRAM device with low-power features enabled and at least one of the memory devices 122 is operated as an LPDDRx DRAM device with at least one low-power feature disabled.

In some embodiments, the memory controller 100 can include a management unit 105 to initialize, configure, and/or monitor characteristics of the memory controller 100. The management unit 105 can include an I/O bus to manage out-of-band data and/or commands, a management unit controller to execute instructions associated with initializing, configuring, and/or monitoring the characteristics of the memory controller, and a management unit memory to store data associated with initializing, configuring, and/or monitoring the characteristics of the memory controller 100. As used herein, the term "out-of-band data and/or commands" generally refers to data and/or commands transferred through a transmission medium that is different from the main transmission medium of a network. For example, out-of-band data and/or commands can be data and/or commands transferred to a network using a different transmission medium than the transmission medium used to transfer data within the network.

In some embodiments, the management unit 105 can be configured to provide PPR management in accordance with the present disclosure. However, embodiments of the present disclosure are not so limited. For example, other portions, components, and/or circuitry of the memory controller 100 can be configured to provide PPR management, individually or in combination, in accordance with the present disclosure.

In some embodiments, the memory controller 100 can include a buffer, such as the cache 112. In some embodiments, the memory controller 100 can be configured to provide sPPR. For instance, the memory controller 100 can be configured to (or configured to cause) write data at a target address, associated with a memory device (e.g., the memory device 122-1) and a PPR request, to the buffer. The target address can be a row address associated with the memory device. The memory controller 100 can be configured to (or configured to cause) execute the PPR request on a row of the memory device corresponding to the target address and, responsive to execution of the PPR request, suspend execution of requests associated with the target address. As used herein, "concurrent" refers to one action being performed at least partially at the same time as another action is being performed. The phrase "in parallel" can be used herein as a synonym for concurrent. The memory controller 100 can be configured to (or configured to cause) write the data stored in the buffer to the memory device at the target address. The memory controller 100 can be configured to (or configured to cause), responsive to completion of the PPR request, resume execution of requests associated with the target address.

The memory controller 100 can be a system controller coupled to the memory device. Although not illustrated as such in FIG. 1, components of the memory controller 100 and/or functionalities thereof can be resident on the memory device (e.g., a local controller). The memory controller 100 can be configured to receive the PPR request from a host device (e.g., the host 103) and/or the memory device. As described herein, in some embodiments, the memory controller 100 can autonomously monitor reliability of rows of the memory device and perform PPR as determined by the memory controller 100.

Although not illustrated as such in FIG. 1, components of the memory controller 100 and/or functionalities thereof can be resident on the memory device (e.g., a local controller). In some embodiments, the memory controller 100 can be configured to provide hPPR. For instance, the memory controller 100 can be configured to (or configured to cause) execute a PPR request at a target address associated with the memory device. The memory controller 100 can be configured to (or configured to cause), concurrent with execution of the PPR request, suspend execution of requests associated with the target address. The memory controller 100 can be configured to (or configured to cause), responsive to completion of the PPR request, resetting a refresh counter of the memory controller 100. Refreshing the refresh counter of the memory controller 100 can enable multiple memory controllers (e.g., local controllers) to be synchronized so that the memory controllers operate concurrently.

FIG. 2 is a diagram 230 representative of PPR management in accordance with a number of embodiments of the present disclosure. Any of the steps and operations described in association with FIG. 2 can be performed by the memory controller 100 described in association with FIG. 1. The host 203 and the memory module 211 can be analogous to the host 103 and one or more of the memory module 111, respectively, described in association with FIG. 1.

The memory module 211 (e.g., control circuitry resident on and/or coupled to the memory module 211) can determine that the memory module 211 needs to execute an internal maintenance operation, such as PPR on one or more rows of the memory module 211. As illustrated by the diagram 230, the memory module 211 can provide log information (e.g., one or more event records) to a host 203. The log information can be a data structure indicative of the condition of the memory module 211. The log information can include a flag (e.g., a maintenance flag) associated with a respective address (e.g., device logical address (DLA), device physical address (DPA), host physical address (HPA)) corresponding to a row of the memory device 222 that, when set, indicates that the memory module 211 has determined that a maintenance operation needs to be performed on the corresponding row. The log information can include a target address (e.g., the address of the affected or faulty row) on which the maintenance operation is to be performed. The log information can include a type of maintenance operation (e.g., PPR) to be performed on the row of the memory module 211 to which the target address corresponds. A maintenance flag indicative of a row needed to be repaired can be sent via the log information. However, if resources for performing PPR are exhausted, when the host attempts to perform PPR, the host can receive signaling indicative of the resources being exhausted. Resources are spare rows of the memory device to which rows to be repaired are temporarily remapped for sPPR or permanently remapped for hPPR.

If the row is not repairable via sPPR (i.e., insufficient resources are available to perform sPPR), then hPPR can be performed to permanently remap the target address to a different row of the memory module 211. If the row is repairable via sPPR (i.e., insufficient resources are available to perform sPPR), then either sPPR or hPPR can be performed to temporarily or permanently remap, respectively, the target address to a different row of the memory device A non-limiting example of a criterion for performing sPPR instead of hPPR is execution time. Execution time to perform hPPR can be longer than execution time to perform sPPR.

As indicated at 232 of FIG. 2, the host 203 can request event records from the memory module 211. As indicated at 234, the memory module 211 can communicate the event records to the host 203. As indicated at 236, the host 203 can communicate a command to the memory module 211 to initiate performance of a maintenance operation by the memory module 211. The type of maintenance operation to be performed can be based on the event records from the memory module 211.

As indicated at 238, the command provided by the host 203 can include an input payload that indicates the type of maintenance operation (e.g., PPR) to be performed, the method by which that type of maintenance operation is to be implemented (e.g., sPPR), and/or and operation-specific parameters. Non-limiting examples of operation-specific parameters include a query resource flag and the target address. As indicated at 240, the command from the host 203 can include return codes that identify resources for repair that are exhausted.

Although FIG. 2 illustrates the host 203 initiating the maintenance operation by communicating a command, embodiments of the present disclosure are not so limited. For instance, in some embodiments, the memory module 211 can initiate a maintenance operation without commands from an external source, such as the host 203. However, in some embodiments, the memory module 211 may need to be enabled by the host 203 to initiate maintenance operations.

Figure 3:
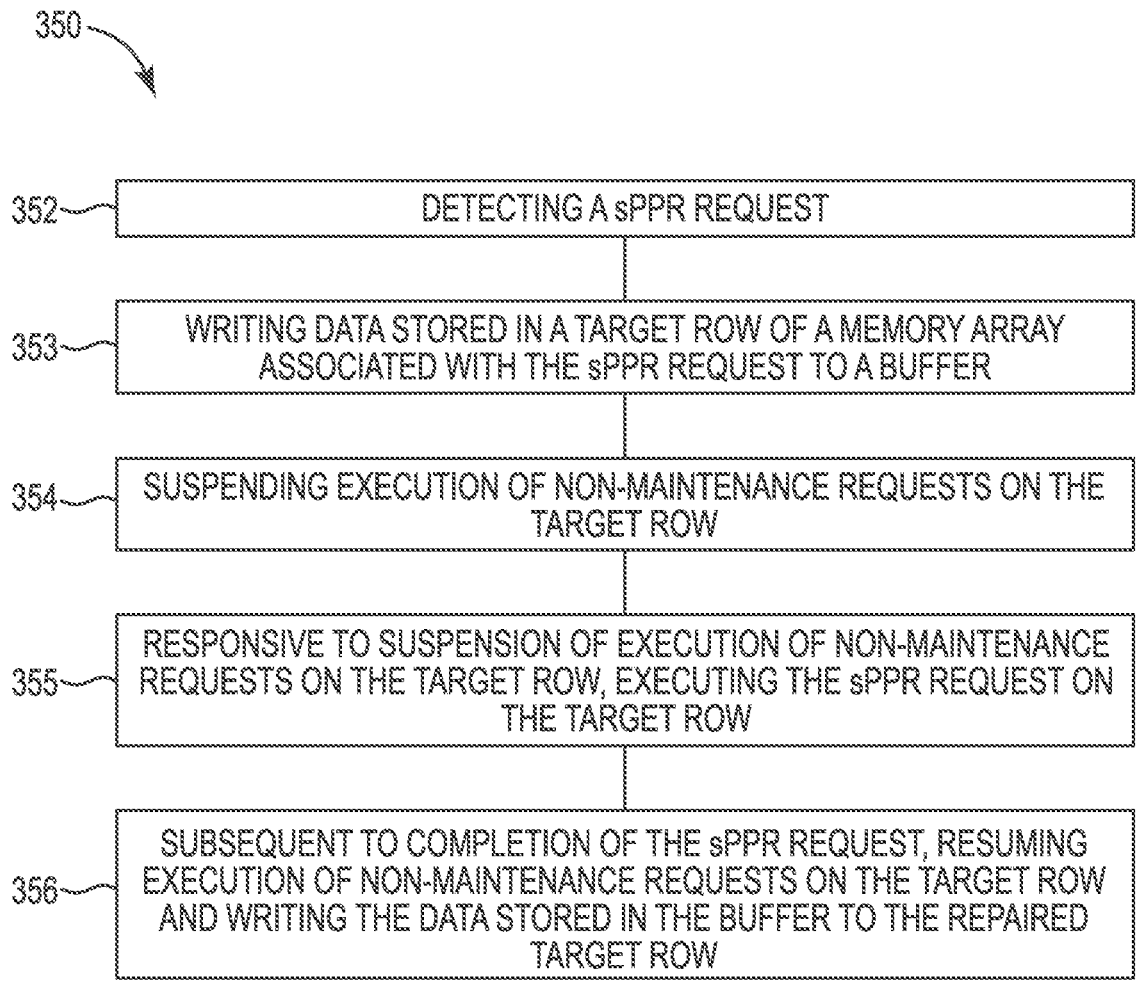
FIG. 3 is a flow diagram corresponding to a method for sPPR in accordance with some embodiments of the present disclosure.

FIG. 3 is a flow diagram corresponding to a method 350 for sPPR in accordance with some embodiments of the present disclosure. The method 350 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 350 is performed by the memory controller 100 described in association with FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 352, the method 350 can include detecting a sPPR request, such as the maintenance operation command described in association with FIG. 2. The sPPR request can be issued by a host and received by a memory device coupled thereto. In some embodiments, the sPPR request can be issued internally (e.g., the memory controller 100 of the memory module 111 described in association with FIG. 1) and received by a local controller of a memory device (e.g., logic circuitry of the memory device 122). In sPPR, data stored in the target row is preserved by copying the data from the target row to another row.

At 353, the method 350 can include writing data stored in a target row of a memory array (e.g., the memory device 122) associated with the sPPR request to a buffer (e.g., the cache 112). Writing the data of the target row to the buffer can include setting a retain flag (e.g., a retain bit) associated with the target row. Setting the retain flag ensures that the data of the target row is not overwritten and/or changed while stored in the buffer. This is important because the data will be written back to the target once the target row has been repaired as part of the sPPR. Setting the retain flag can include changing a bit to a particular state (e.g., 1). Writing the data of the target row to the buffer can include writing the data of the target row to the buffer in a piecemeal manner (e.g., byte by byte). The data of the target row can be written to the buffer by multiple write operations, each of which writing a respective subset of the data of the target row. In some embodiments, a first write operation can be performed to write a first portion of the data of the target row to the buffer and a second write operation can be performed to write a second portion of the data of the target row to the buffer. After the data is written to the buffer, the retain flag is set to avoid eviction of the data from the buffer.

At 354, the method 350 can include suspending execution of non-maintenance requests on the target row. At 355, the method 350 can include, responsive to suspension of execution of non-maintenance requests on the target row, executing the sPPR request to repair the target row. The sPPR request can be executed by a local controller of the memory array. Although not illustrated as such in FIG. 3, the portions of the method 350 described in association with 354 and 355 can occur in parallel. In some embodiments, the memory device can queue requests from a memory device controller in queues of a local controller of the memory device.

By transferring data stored in the target row to the buffer and remapping the target row to the buffer, requests associated with the target row can be served via the buffer and the data stored therein without impacting the functionality. This remedies the potential hazard of losing data and/or data being unavailable during PPR. For instance, in some embodiments, a non-maintenance request can be executed on the buffer concurrently with execution of the sPPR request. The memory controller 100 can service non-maintenance requests from a host (e.g., the host 103) associated with the target row while the target row is being repaired by executing non-maintenance requests on the buffer. The memory controller 100 can execute non-maintenance requests on the buffer and the sPPR request on the target row concurrently.

At 356, the method 350 can include subsequent to completion of the sPPR request, resuming execution of non-maintenance requests on the target row and writing the data stored in the buffer to the repaired target row. Requests queued while execution of requests associated with the target row was suspended can be executed. Writing the data can include unsetting the retain flag. Unsetting the retain flag enables data stored in the buffer to be overwritten and/or changed. Unsetting the retain flag can include changing a bit to a particular state opposite to the state corresponding to the retain flag being set (e.g., 0). In some embodiments, the method 350 can include, subsequent to completion of the sPPR request, resetting a refresh counter of a controller coupled to the memory array.

Figure 4:
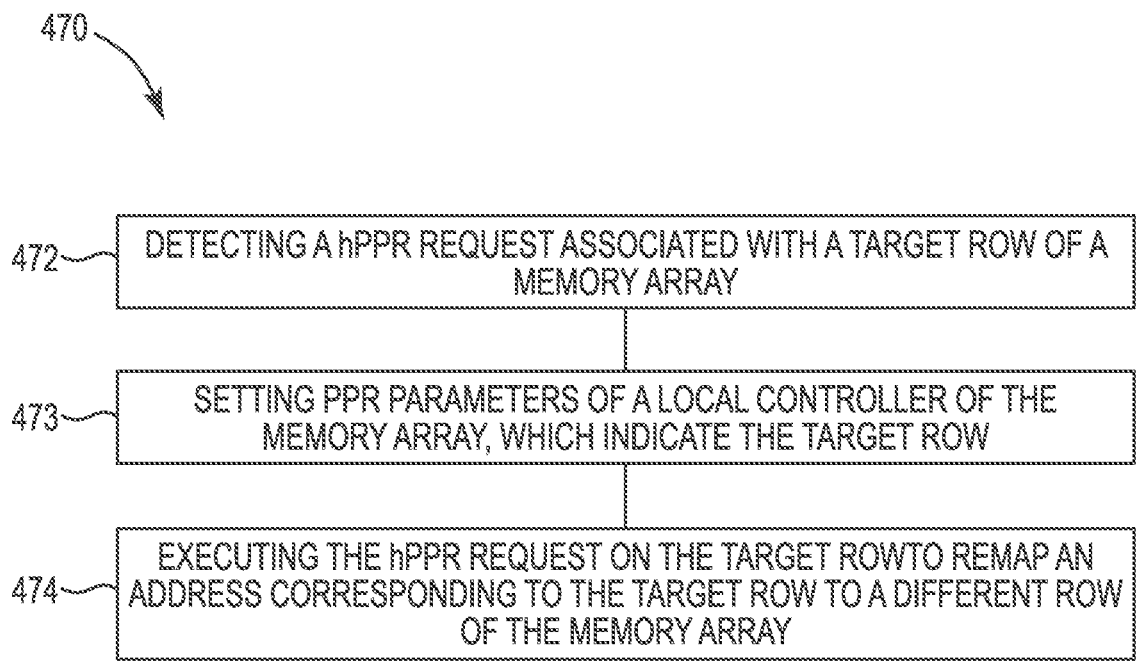
FIG. 4 is a flow diagram corresponding to a method for hPPR in accordance with some embodiments of the present disclosure.

FIG. 4 is a flow diagram corresponding to a method 470 for hPPR in accordance with some embodiments of the present disclosure. The method 470 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 470 is performed by the memory controller 100 described in association with FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 472, the method 470 can include detecting a hPPR request. The hPPR request is associated with a target row of a memory array (e.g., the memory device 122). The hPPR request can be issued by a host and received by a memory module (e.g., the memory module 111) coupled thereto. In some embodiments, the hPPR request can be issued internally (e.g., by the memory controller 100, a memory device controller) and received by a local controller of the memory array. At 473, the method 470 can include setting PPR parameters of a local controller of the memory array. The PPR parameters can indicate the target row.

At 474, the method 470 can include executing the hPPR request on the target row to remap an address corresponding to the target row to a different row of the memory array. Although not illustrated in FIG. 4, the method 470 can include executing requests, by the local controller, on the different row. Because hPPR remaps the address from corresponding to the target row to corresponding to the different row, requests associated with the address can be executed as soon as the hPPR request is completed. In some embodiments, the method 470 can include, subsequent to completion of the hPPR request, resetting a refresh counter of the local controller.

Figure 5:
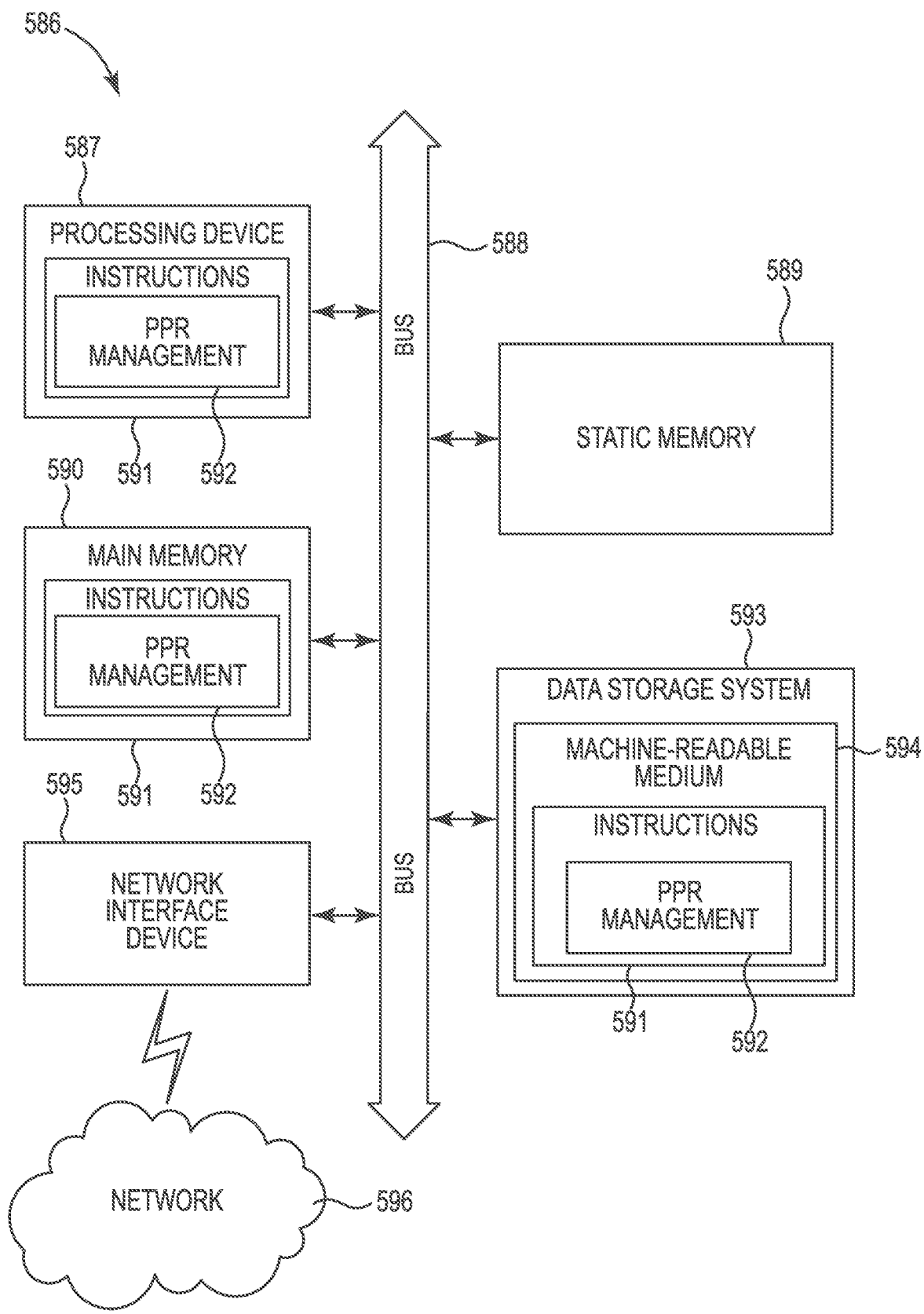
FIG. 5 is a block diagram of a computer system implementing PPR management in accordance with a number of embodiments of the present disclosure.

FIG. 5 is a block diagram of a computer system 586 implementing PPR management in accordance with a number of embodiments of the present disclosure. The computer system 586 can be a machine within which a set of instructions, for causing the machine to perform any one or more of the methodologies discussed herein, can be executed. In some embodiments, the computer system 586 can correspond to a host system (e.g., the host 103 described in association with FIG. 1) that includes, is coupled to, or utilizes one or more memory modules (e.g., the memory module 111) or can be used to perform the operations of a controller (e.g., the memory controller 100) to execute an operating system to perform operations associated with PPR management. In alternative embodiments, the machine can be connected (e.g., networked) to other machines in a local access network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The computer system 586 includes a processing device 587, a main memory 590 (e.g., ROM, flash memory, DRAM such as synchronous DRAM (SDRAM) or Rambus DRAM (RDRAM), etc.), a static memory 589 (e.g., flash memory, static random access memory (SRAM), etc.), and a data storage system 593, which communicate with each other via a bus 588.

The processing device 587 represents one or more general-purpose processing devices such as a microprocessor, a central processing unit, or the like. More particularly, the processing device 587 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 587 can also be one or more special-purpose processing devices such as an application specific integrated circuit (ASIC), a field programmable gate array (FPGA), a digital signal processor (DSP), network processor, or the like. The processing device 587 is configured to execute instructions 591 for performing the operations and steps discussed herein. The computer system 587 can further include a network interface device 595 to communicate over the network 596.

The data storage system 593 can include a machine-readable storage medium 594 (also referred to as a computer-readable medium) on which one or more sets of instructions 591 or software embodying any one or more of the methodologies or functions described herein is stored. The instructions 591 can also reside, completely or at least partially, within the main memory 590 and/or within the processing device 587 during execution thereof by the computer system 586, the main memory 590, and the processing device 587 also constituting machine-readable storage media. In some embodiments, the machine-readable storage medium 594, data storage system 593, and/or main memory 590 can correspond to the memory module 111 and/or the memory devices 122.

In some embodiments, the instructions 591 can include instructions to implement functionality for PPR management (represented in FIG. 5 at 592). For instance, the instructions 591 can include instructions to detect a PPR request associated with a target row address associated with a memory device and execute the PPR request. The instructions 591 can include instructions to, concurrent with execution of the PPR request, suspend execution of requests associated with the target row address. The instructions 591 can include instructions to, subsequent to completion of the PPR request, resume execution of requests associated with the target row address.

The instructions 591 can include instructions to, responsive to the PPR request being a sPPR request, write data at the target row address to a buffer, execute the sPPR request at the target row address, and, responsive to completion of the sPPR request, write the data stored in the buffer to the memory device at the target row address. The instructions 591 can include instructions to, concurrent with execution of the sPPR request, set a retain flag associated with the target row address. The instructions 591 can include instructions to, responsive to completion of the sPPR request, unset the retain flag.

The instructions 591 can include instructions to, responsive to the PPR request being a hPPR request, executing the hPPR request at the target row address. The instructions 591 can include instructions to, responsive to completion of the hPPR request, reset a refresh counter associated with the memory device.

Although the machine-readable storage medium 594 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   detecting a soft post package repair (sPPR) request;
   writing data stored in a target row of a memory array associated with the sPPR request to a buffer;
   suspending execution of non-maintenance requests on the target row;
   responsive to suspension of execution of non-maintenance requests on the target row, executing the sPPR request on the target row; and
   subsequent to completion of the sPPR request:
      resuming execution of non-maintenance requests on the target row; and
      writing the data stored in the buffer to the repaired target row.

2. The method of claim 1, wherein writing the data of the target row to the buffer comprises setting a retain flag associated with the target row.

3. The method of claim 2, wherein writing the repaired data comprises unsetting the retain flag.

4. The method of claim 1, wherein writing the data of the target row to the buffer comprises:
   performing a first write operation to write a first portion of the data of the target row to the buffer; and
   performing a second write operation to write a second portion of the data of the target row to the buffer.

5. The method of claim 1, wherein suspending execution of requests associated with the target row comprises queueing requests associated with the target row while the target row is being repaired.

6. The method of claim 1, further comprising executing a non-maintenance request on data stored in the buffer concurrent with executing the sPPR request on the target row.

7. The method of claim 1, wherein suspending execution of non-maintenance requests on the target row and executing the sPPR request on the target row occur concurrently.

8. The method of claim 1, further comprising, subsequent to completion of the sPPR request, resetting a refresh counter of a controller coupled to the memory array.

9. A method, comprising:
   detecting a hard post package repair (hPPR) request, wherein the hPPR request is associated with a target row of a memory array;
   setting PPR parameters of a local controller of the memory array, wherein the PPR parameters indicate the target row;
   executing the hPPR request on the target row to remap an address corresponding to the target row to a different row of the memory array; and
   subsequent to completion of the hPPR request, resetting a refresh counter of the local controller.

10. The method of claim 9, further comprising subsequent to completion of the hPPR request, executing, by the local controller, requests associated with the remapped target row.

11. An apparatus, comprising:
   a control circuitry comprising a buffer, wherein the control circuitry is configured to:
      suspend execution of requests associated with a target address associated with a memory device and a post package repair (PPR) request;
      write data at a target address to the buffer; and
      execute the PPR request on a row of the memory device corresponding to the target address.

12. The apparatus of claim 11, wherein the control circuitry is further configured to write the data stored by the buffer to the memory device at the target address.

13. The apparatus of claim 11, wherein the control circuitry is further configured to, subsequent to completion of the PPR request, resume execution of requests associated with the target address.

14. The apparatus of claim 11, further comprising the memory device, wherein the control circuitry comprises a memory controller of a memory module comprising the memory device.

15. The apparatus of claim 11, further comprising the memory device, wherein the control circuitry comprises a local controller resident on the memory device.

16. The apparatus of claim 11, wherein the control circuitry is further configured to receive the PPR request from a host.

17. The apparatus of claim 11, wherein the control circuitry is further configured to receive the PPR request from the memory device.

18. An apparatus, comprising:
   a memory device; and
   a local controller resident on the memory device, wherein the local controller is configured to:
      execute a post package repair (PPR) request on a first row of the memory device corresponding to a target address associated with the memory device;
      as part of execution of the PPR request, remap the target address to a second row of the memory device; and
      subsequent to completion of the PPR request, reset a refresh counter of the local controller.

19. A non-transitory medium storing instructions executable by a processing device to:
   detect a post package repair (PPR) request associated with a target row address associated with a memory device;
   execute the PPR request on a row of the memory device to which the target row address corresponds;
   responsive to the PPR request being a soft PPR (sPPR) request:
      write data at the target row address to a buffer;
      execute the sPPR request at the target row address; and
      responsive to completion of the sPPR request, write the data stored in the buffer to the memory device at the target row address;
   responsive to the PPR request being a hard PPR (hPPR) request:

execute the hPPR request at the target row address; and responsive to completion of the hPPR request, reset a refresh counter associated with the memory device; and subsequent to completion of the PPR request, resume execution of requests associated with the target row address.

20. The medium of claim 19, further storing instructions executable to:

concurrent with execution of the sPPR request, set a retain flag associated with the target row address; and responsive to completion of the sPPR request, unset the retain flag.

* * * * *